(12) United States Patent
Fang et al.

(10) Patent No.: US 11,257,788 B2
(45) Date of Patent: Feb. 22, 2022

(54) SEMICONDUCTOR DEVICE PACKAGE WITH STACKED DIE HAVING TRACES ON LATERAL SURFACE

(71) Applicant: Advanced Semiconductor Engineering, Inc., Kaohsiung (TW)

(72) Inventors: Hsu-Nan Fang, Kaohsiung (TW); Chun-Jun Zhuang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 104 days.

(21) Appl. No.: 16/581,009

(22) Filed: Sep. 24, 2019

(65) Prior Publication Data
US 2021/0091042 A1     Mar. 25, 2021

(51) Int. Cl.
*H01L 25/065* (2006.01)
*H01L 23/31* (2006.01)
(Continued)

(52) U.S. Cl.
CPC ........ *H01L 25/0657* (2013.01); *H01L 21/561* (2013.01); *H01L 21/568* (2013.01);
(Continued)

(58) Field of Classification Search
CPC . H01L 25/0657; H01L 25/50; H01L 23/3128; H01L 23/49816; H01L 23/49838; H01L 24/16; H01L 24/32; H01L 24/81; H01L 24/83; H01L 24/94; H01L 21/561; H01L 21/568; H01L 21/6835; H01L 21/78; H01L 2224/68327; H01L 2224/68372; H01L 2224/16145; H01L 2224/32145; H01L 2224/81005; H01L 2224/83005; H01L 2225/06513; H01L 2225/06524; H01L 2225/06562; H01L 2225/06568; H01L 2225/06586

See application file for complete search history.

(56) References Cited

U.S. PATENT DOCUMENTS 9,418,922 B2* 8/2016 Paek .................. H01L 25/074
2010/0181661 A1* 7/2010 Takemoto ............ H01L 24/24
257/686
(Continued)

*Primary Examiner* — Lex H Malsawma
(74) *Attorney, Agent, or Firm* — Foley & Lardner LLP

(57) ABSTRACT

A semiconductor device package includes a first electronic component, a plurality of first conductive traces, a second electronic component, a plurality of second conductive traces and a plurality of first conductive structures. The first electronic component has a first active surface. The first conductive traces are disposed on and electrically connected to the first active surface. The second electronic component is stacked on the first electronic component. The second electronic component has an inactive surface facing the first active surface, a second active surface opposite the inactive surface, and at least one lateral surface connecting the second active surface and the inactive surface. The second conductive traces are electrically connected to the second active surface, and extending from the second active surface to the lateral surface. The first conductive structures are electrically connecting the second conductive traces to the first conductive traces, respectively.

21 Claims, 21 Drawing Sheets

(51) Int. Cl.
  *H01L 23/498* (2006.01)
  *H01L 23/00* (2006.01)
  *H01L 25/00* (2006.01)
  *H01L 21/683* (2006.01)
  *H01L 21/78* (2006.01)
  *H01L 21/56* (2006.01)

(52) U.S. Cl.
  CPC .......... *H01L 21/6835* (2013.01); *H01L 21/78* (2013.01); *H01L 23/3128* (2013.01); *H01L 23/49816* (2013.01); *H01L 23/49838* (2013.01); *H01L 24/16* (2013.01); *H01L 24/32* (2013.01); *H01L 24/81* (2013.01); *H01L 24/83* (2013.01); *H01L 24/94* (2013.01); *H01L 25/50* (2013.01); *H01L 2221/68327* (2013.01); *H01L 2221/68372* (2013.01); *H01L 2224/16145* (2013.01); *H01L 2224/32145* (2013.01); *H01L 2224/81005* (2013.01); *H01L 2224/83005* (2013.01); *H01L 2225/06513* (2013.01); *H01L 2225/06524* (2013.01); *H01L 2225/06562* (2013.01); *H01L 2225/06568* (2013.01); *H01L 2225/06586* (2013.01)

(56) References Cited

U.S. PATENT DOCUMENTS

2010/0258929 A1\* 10/2010 Kim .................. H01L 25/0657
  257/686
2013/0277831 A1\* 10/2013 Yoon ...................... H01L 25/50
  257/737
2021/0043606 A1\* 2/2021 Bowers ................ H01L 25/50

\* cited by examiner

SEMICONDUCTOR DEVICE PACKAGE WITH STACKED DIE HAVING TRACES ON LATERAL SURFACE

BACKGROUND

1. Technical Field

The present disclosure relates to a semiconductor device package and a method for manufacturing the same, and more particularly to a semiconductor device package including a stacked structure having a plurality semiconductor dies stacking on each other, and conductive traces covering lateral surface of the stack structure and electrically connecting the semiconductor dies, and a method for manufacturing the same.

2. Description of the Related Art

Comparative stacked structure such as package on package (POP) uses wire bond to interconnect the stacked semiconductor dies. The wire bond, however, occupies large space, and thus hinders miniaturization of semiconductor device package. In addition, the wire bond cannot meet high-density input/output (I/O) specification for some advanced semiconductor device package. Furthermore, low productivity of the wire bond is another issue.

SUMMARY

In some embodiments, a semiconductor device package includes a first electronic component, a plurality of first conductive traces, a second electronic component, a plurality of second conductive traces and a plurality of first conductive structures. The first electronic component has a first active surface. The first conductive traces are disposed on and electrically connected to the first active surface. The second electronic component is stacked on the first electronic component. The second electronic component has an inactive surface facing the first active surface, a second active surface opposite the inactive surface, and at least one lateral surface connecting the second active surface and the inactive surface. The second conductive traces are electrically connected to the second active surface, and extending from the second active surface to the lateral surface. The first conductive structures are electrically connecting the second conductive traces to the first conductive traces, respectively.

In some embodiments, a semiconductor device package includes a first semiconductor die, a first conductive trace, a second semiconductor die, a second conductive trace and a conductive bonding enhancing structure. The first semiconductor die has a first active surface and at least one first lateral surface connecting the first active surface. The first conductive trace is disposed on the first active surface and electrically connected to the first semiconductor die, and extending from the first active surface to the second lateral surface. The second semiconductor die is stacking on the first semiconductor die and partially exposing the first active surface of the first semiconductor die. The second semiconductor die has an inactive surface facing the first active surface, a second active surface opposite the inactive surface, and at least one second lateral surface connecting the second active surface and the inactive surface. The second conductive trace is electrically connected to the second semiconductor die, and extending from the second active surface to the second lateral surface. The conductive bonding enhancing structure is disposed at a joint corner between the first active surface and the at least one second lateral surface.

In some embodiments, a method for manufacturing a semiconductor device package includes the following operations. A plurality of semiconductor dies are formed. Each semiconductor die includes a conductive trace extending from an active surface to a lateral surface. A stacked structure is formed by stacking the semiconductor dies. A first conductive structure is formed to electrically connect the conductive trace of one of the semiconductor dies to the conductive trace of another one of the semiconductor.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
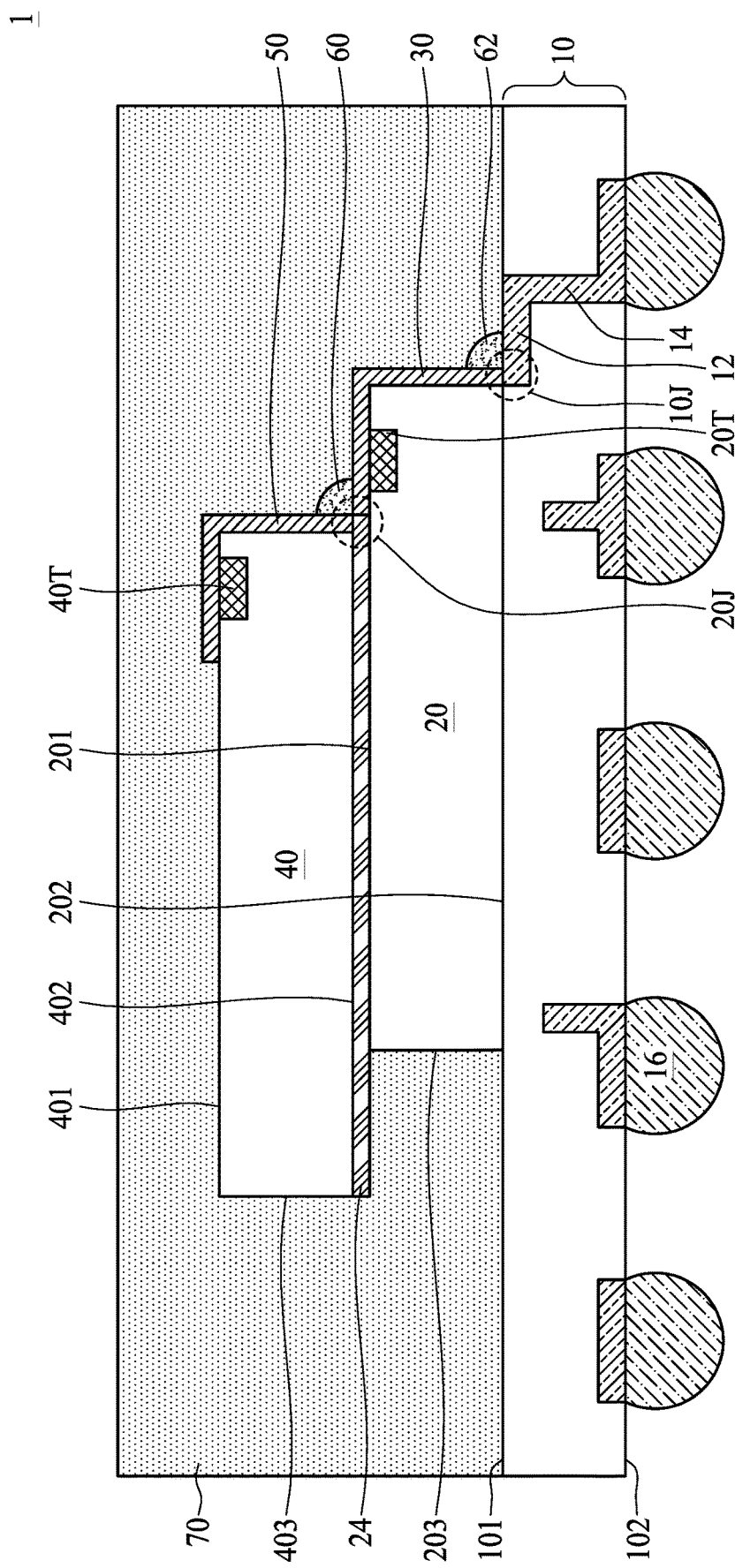
FIG. 1 is a cross-sectional view of a semiconductor device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "active surface" may refer to a surface of an electronic component on which contact terminals such as contact pads are disposed, and the term "inactive surface" may refer to another surface of the electronic component opposite to the active surface on which no contact terminals are disposed.

Figure 1A:
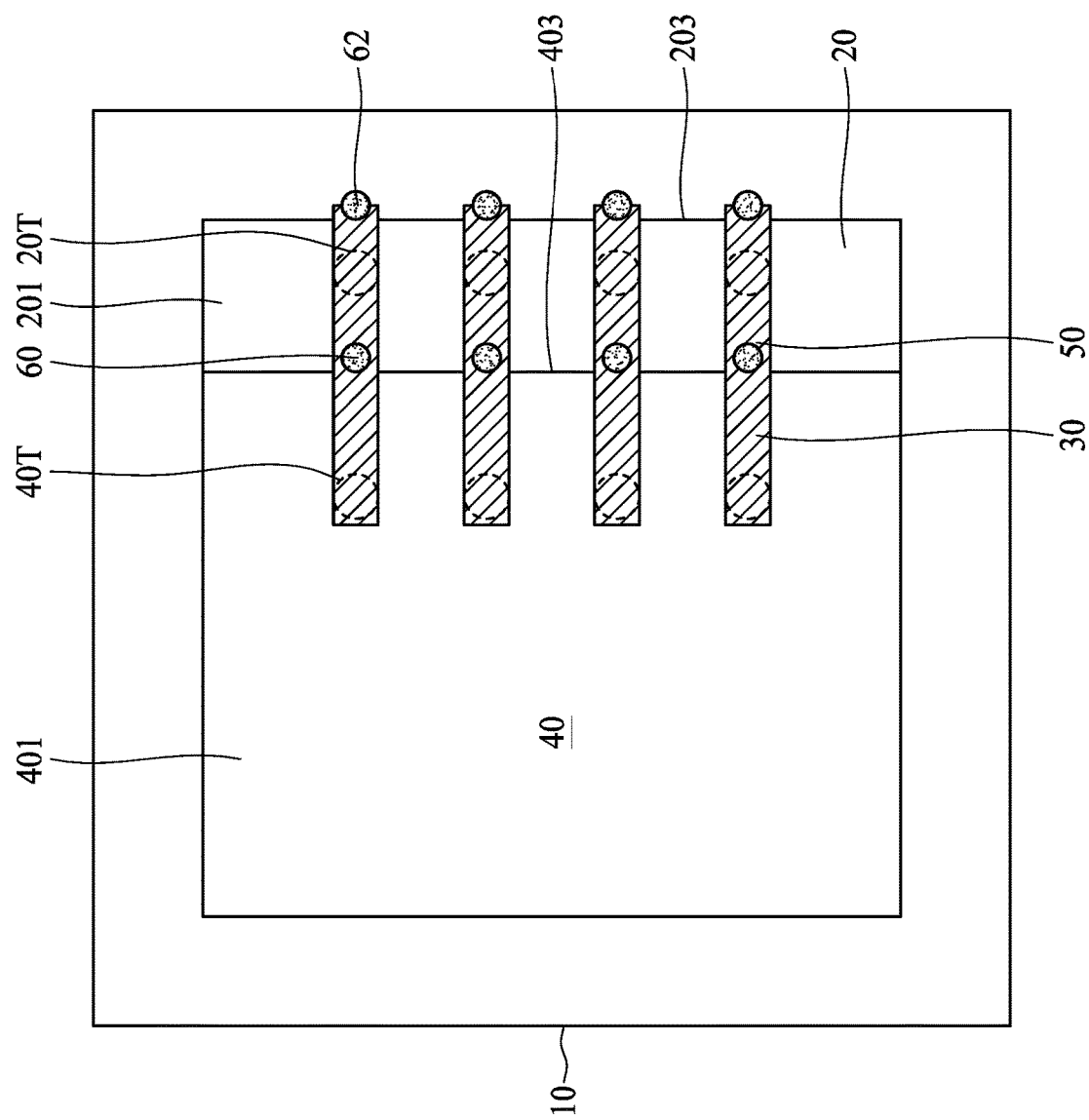
FIG. 1A is a top view of a semiconductor device package of FIG. 1 in accordance with some embodiments of the present disclosure.

FIG. 1 is a cross-sectional view of a semiconductor device package 1 in accordance with some embodiments of the present disclosure, and FIG. 1A is a top view of a semiconductor device package 1 of FIG. 1 in accordance with some embodiments of the present disclosure. In FIG. 1A, some component such as an encapsulation layer is omitted. As shown in FIG. 1 and FIG. 1A, the semiconductor device package 1 includes a stacked structure including a plurality electronic components stacking on one another. The electronic components may include active electronic components, passive electronic components, or a combination thereof. Each electronic component may include an active surface, an inactive surface opposite to the active surfaces, and lateral surfaces connecting the active surface and the inactive surface. In some embodiments, the lateral surfaces may be substantially perpendicular to the active surface and the inactive surface. In some embodiments, the electronic components may include semiconductor dies such as logic dies, memory dies such as high bandwidth memory (HBM) or other types of semiconductor dies. In some embodiments, some or all of the stacking semiconductor dies are TSV-free (through-silicon-via-free) semiconductor dies. In some other embodiments, the electronic components may include the first electronic component comprises a circuit layer, and the second electronic component comprises a semiconductor die.

The semiconductor device package 1 includes a first electronic component (also referred to as a first semiconductor die) 20, first conductive traces 30, a second electronic component (also referred to as a second semiconductor die) 40, and second conductive traces 50. The first electronic component 20 may include a plurality of contact terminals 20T such as contact pads electrically connected to internal electrical circuit in the first electronic component 20, and exposed from an active surface 201. The first conductive traces 30 are disposed on and electrically connected to the active surface 201 of the first electronic component 20. For example, each first conductive trace 30 may cover a portion of the active surface 201 of the first electronic component 20 and electrically contact the respective contact terminal 20T. In some embodiments, the first conductive traces 30 may further extend from the active surface 201 to a lateral surface 203 of the first electronic component 20. In some embodiments, the first conductive traces 30 may be in contact with the active surface 201 and the lateral surface 203 of the first electronic component 20. The first conductive traces 30 may be substantially conformal to the active surface 201 and the lateral surface 203 of the first electronic component 20. The material of the first conductive traces 30 may include metal such as copper or the like, and can be formed by physical vapor deposition (PVD) such as sputtering, electroplating, printing or other suitable processes.

The second electronic component 40 may include a plurality of contact terminals 40T such as contact pads electrically connected to internal electrical circuit in the second electronic component 40, and exposed from an active surface 401. The second electronic component 40 is stacking on the first electronic component 20 with an inactive surface 402 facing the active surface 201 of the first electronic component 20. In some embodiments, the inactive surface 402 of the second electronic component 40 is adhered to the active surface 201 of the first electronic component 20 with an adhesive layer 24 such as a die attaching film (DAF). In some embodiments, the first electronic component 20 and the second electronic component 40 include homogeneous semiconductor dies. For example, the homogeneous semiconductor dies may include the same type semiconductor die with the same dimension such as the same length, width and/or height. The second electronic component 40 may be stacking on the first electronic component 20 and offset from the first electronic component 20 in a lateral direction such that the second electronic component 40 exposes a portion of the active surface 201 with the contact terminals 20T, and covers the other portion of the active surface 201 of the first electronic component 20.

The second conductive traces 50 are disposed on and electrically connected to an active surface 401 of the second electronic component 40, and extending from the active surface 401 to a lateral surface 403 of the second electronic component 40. For example, each second conductive trace 50 may cover a portion of the active surface 401 of the second electronic component 40 and electrically contact the respective contact terminal 40T. In some embodiments, the second conductive traces 50 may be in contact with the active surface 401 and the lateral surface 403 of the second electronic component 40. The second conductive traces 50 may be substantially conformal to the active surface 401 and the lateral surface 403 of the second electronic component 40. The material of the second conductive traces 50 may include metal such as copper or the like, and can be formed by physical vapor deposition (PVD) such as sputtering, electroplating, printing or other suitable processes.

The first conductive structures 60 electrically connect the second conductive traces 50 to the respective first conductive traces 30. The first conductive structure 60 may be configured as a conductive bonding enhancing structure to enhance the joint between the first conductive trace 30 and the second conductive trace 50. In some embodiments, the first conductive structures 60 are disposed at a joint corner 20J between the first active surface 201 of the first electronic component 20 and the lateral surface 403 of the second electronic component 40. In some embodiments, the material of the first conductive structures 60 may include, for example but is not limited to be, a flow-able conductive material including a solder material or the like.

The semiconductor device package 1 may further include an encapsulation layer 70 encapsulating the first electronic component 20 and the second electronic component 40. In some embodiments, the encapsulation layer 70 may encapsulate the active surface 201 and at least one lateral surface 203 of the first electronic component 20, and the active surface 401 and at least one lateral surface 403 of the second electronic component 40. The encapsulation layer 70 may encapsulate the first conductive traces 30, the second conductive traces 50 and the first conductive structures 60 to enhance the joint among the first conductive trace 30, the second conductive trace 50 and the first conductive structures 60. The encapsulation layer 70 may include molding compound such epoxy resin, and fillers such as silicon oxide fillers may be filled in the molding compound. In some other embodiments, the encapsulation layer 70 may expose the active surface 401 of the second electronic component 40.

The semiconductor device package 1 may further include a circuit layer 10. The first electronic component 20 is disposed on a first surface 101 of the circuit layer 10, and electrically connected to the circuit layer 10. In some embodiments, the circuit layer 10 may include a redistribution layer (RDL), a circuit board or the like. The circuit layer 10 may include conductive wirings 12 and/or conductive vias 14.

In some embodiments, the semiconductor device package 1 may further include a plurality of second conductive structures 62 electrically connecting the first conductive traces 30 to the circuit layer 10. For example, the second conductive structure 62 may be configured as a conductive bonding enhancing structure to enhance the joint between the first conductive trace 30 and the circuit board 10. In some embodiments, the second conductive structures 62 are disposed at a joint corner 10J between the first surface 101 of the circuit layer 10 and at least one lateral surface 203 of the first electronic component 20. In some embodiments, the material of the second conductive structures 62 may include a flow-able conductive material including a solder material or the like.

In some embodiments, the semiconductor device package 1 may further include electrical conductors 16 such as solder balls or other suitable conductors disposed on a second surface 102 of the circuit layer 10. The electrical conductors 16 are electrically connected to the first electronic component 20 through the circuit layer 10 and the first conductive traces 30 for external electrical connection.

In some embodiments, the first electronic component 20 and the second electronic component 40 may include homogeneous semiconductor dies, and the first contact terminals 20T and the second contact terminals 40T may have the same arrangement. For example, the first contact terminals 20T and the second contact terminals 40T are respectively arranged in a column. Accordingly, each first conductive trace 30 and the respective second conductive trace 50 may be connected as a strip pattern of the same length when viewed from a top perspective as shown in FIG. 1A. The first conductive trace 30 and the respective second conductive trace 50 may be connected as a stepped structure when view from a side perspective as shown in FIG. 1. In some embodiments, an end of each first conductive trace 30 and an end of the respective second conductive trace 50 are close to each other. The end of the first conductive trace 30 and the end of the second conductive trace 50 may be in contact with each other, or separated from each other due to process variation or other reasons. The first conductive structure 60 can allow misalignment between the first electronic component 20 and the second electronic component 40, and enhance the electrical connection between the first conductive trace 30 and the second conductive trace 50. The first conductive trace 30 may be conformal to the active surface 201 and the lateral surface 203 of the first electronic component 20, and the second conductive trace 50 may be conformal to the active surface 401 and the lateral surface 403 of the second electronic component 40.

Compared to a semiconductor device package using wire bonding to electrically connect the stacked semiconductor dies and including thicker encapsulation layer to encapsulate the bond wires, the semiconductor device package 1 is beneficial for at least the following reasons. The semiconductor device package 1 can use a thinner encapsulation layer 70, and thus the overall thickness can be reduced. In addition, the electrical transmission path of the first conductive traces 30 and the second conductive traces 50 is shorter than the bonding wires. Furthermore, the productivity and reliability of first conductive traces 30 and the second conductive traces 50 is higher than that of the bonding wires. The semiconductor device package 1 allows stacking more electronic components with conductive traces, while the number of stacking electronic components with bonding wires is constrained.

The semiconductor device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 1B:
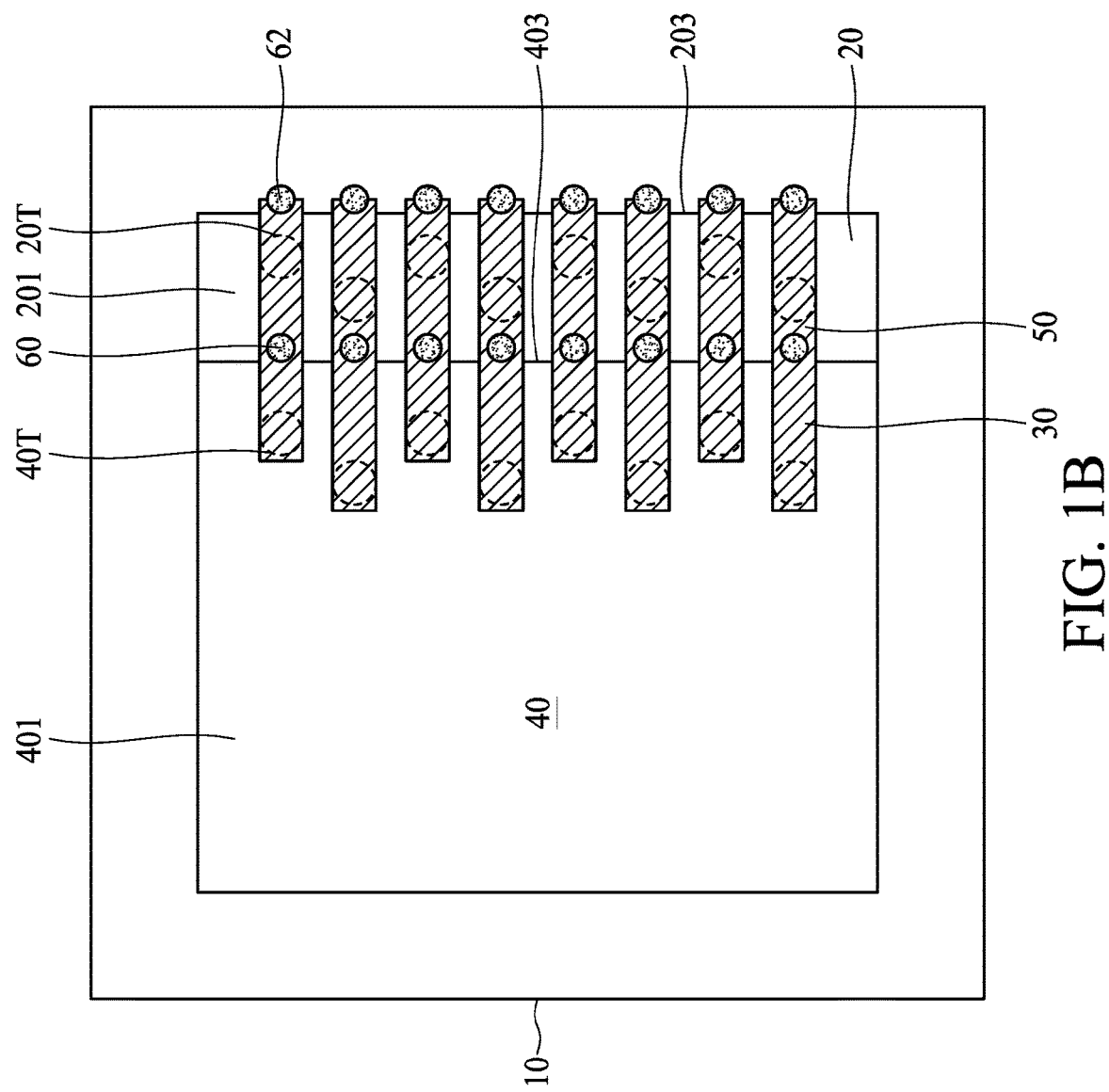
FIG. 1B is a top view of a semiconductor device package in accordance with some embodiments of the present disclosure.

FIG. 1B is a top view of a semiconductor device package 1A in accordance with some embodiments of the present disclosure. In contrast to the semiconductor device package 1 in FIG. 1, the first contact terminals 20T and the second contact terminals 40T of the semiconductor device package 1A are respectively arranged in multiple columns. In some embodiments, the multiple columns of the first contact terminals 20T and the multiple columns of the second contact terminals 40T are staggered, and each first conductive trace 30 and the respective second conductive trace 50 may be connected as a conductive strip. In some other embodiments, the multiple columns of the first contact terminals 20T and the multiple columns of the second contact terminals 40T may be aligned, and each first conductive trace 30 and the respective second conductive trace 50 may be connected as a bending pattern or a curved pattern when viewed from a top perspective.

Figure 2A:
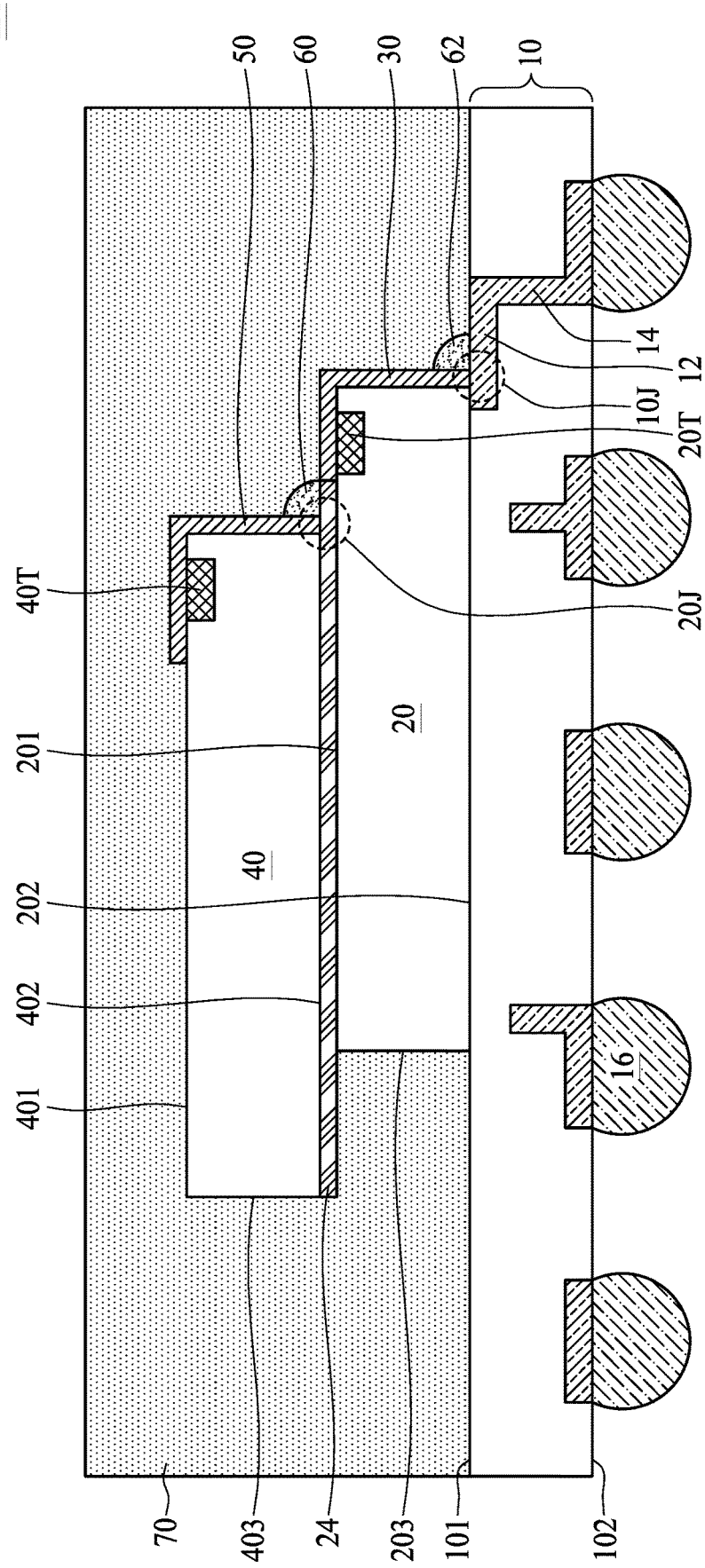
FIG. 2A is a cross-sectional view of a semiconductor device package in accordance with some embodiments of the present disclosure.

FIG. 2A is a cross-sectional view of a semiconductor device package 2A in accordance with some embodiments of the present disclosure. In contrast to the semiconductor device package 1 in FIG. 1, the first conductive traces 30 are separated from the inactive surface 402 of second electronic component 40 and the second conductive traces 50. Each of the first conductive traces 30 is electrically connected to the respective second electronic component 40 through the first conductive structure 60.

Figure 2B:
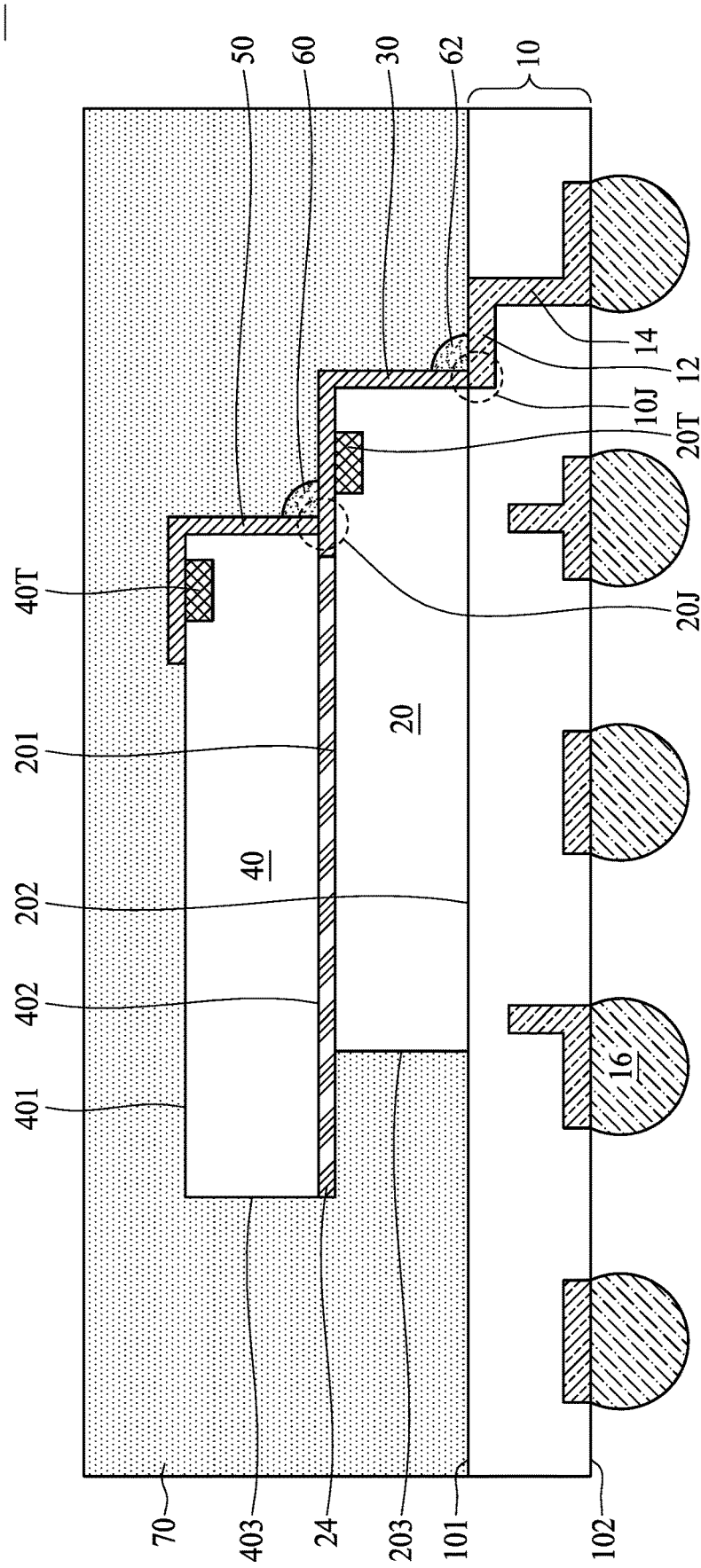
FIG. 2B is a cross-sectional view of a semiconductor device package in accordance with some embodiments of the present disclosure.

FIG. 2B is a cross-sectional view of a semiconductor device package 2B in accordance with some embodiments of the present disclosure. In contrast to the semiconductor device package 1 in FIG. 1, the first conductive traces 30 are partially covered by the inactive surface 402 of the second electronic component 40. The first conductive structure 60 covers both the first conductive trace 30 and the second conductive trace 50 to enhance the joint between the first conductive trace 30 and the second conductive trace 50.

Figure 3:
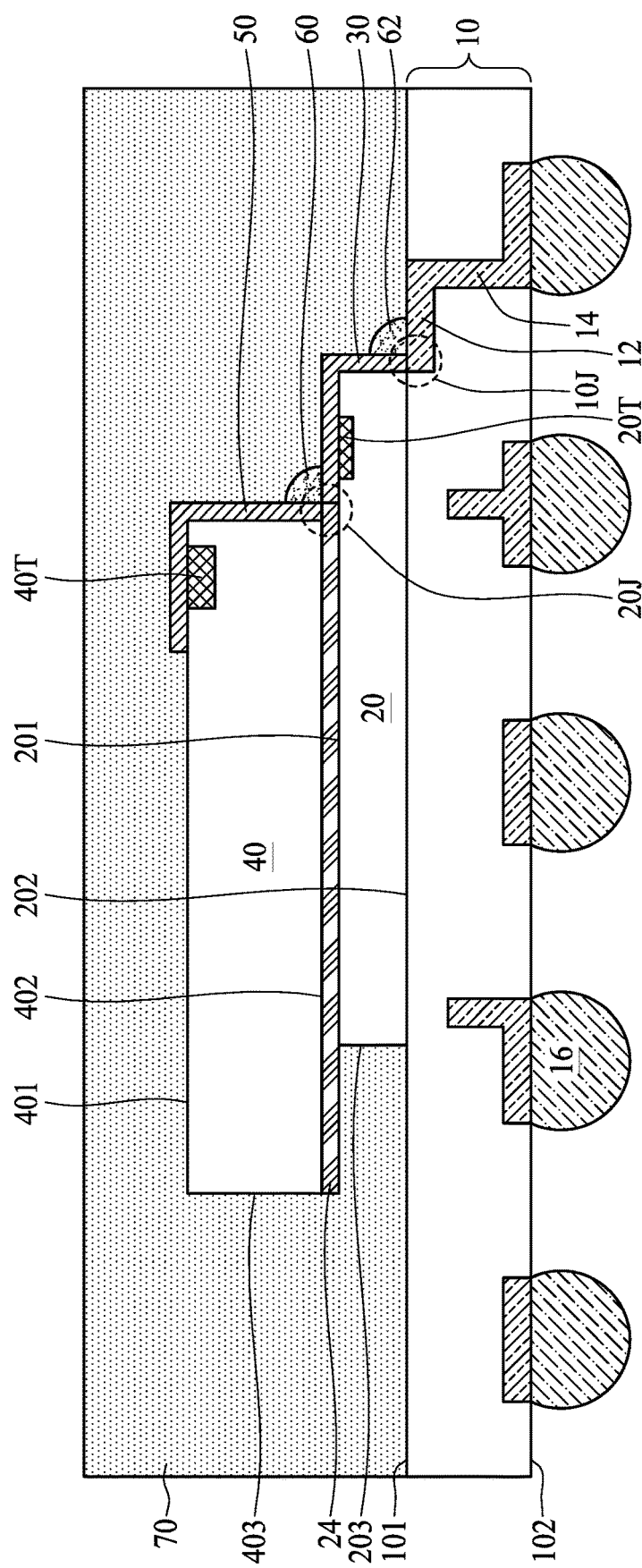
FIG. 3 is a cross-sectional view of a semiconductor device package in accordance with some embodiments of the present disclosure.

FIG. 3 is a cross-sectional view of a semiconductor device package 3 in accordance with some embodiments of the present disclosure. In contrast to the semiconductor device package 1 in FIG. 1, the thickness of the first electronic component 20 is smaller than that of the second electronic component 40. In some embodiments, the first electronic component 20 and the second electronic component 40 may be homogeneous semiconductor dies, and the first electronic component 20 may be grinded from the inactive surface 202 to reduce its thickness. Accordingly, the overall thickness of the semiconductor device package 3 can be further reduced.

Figure 4:
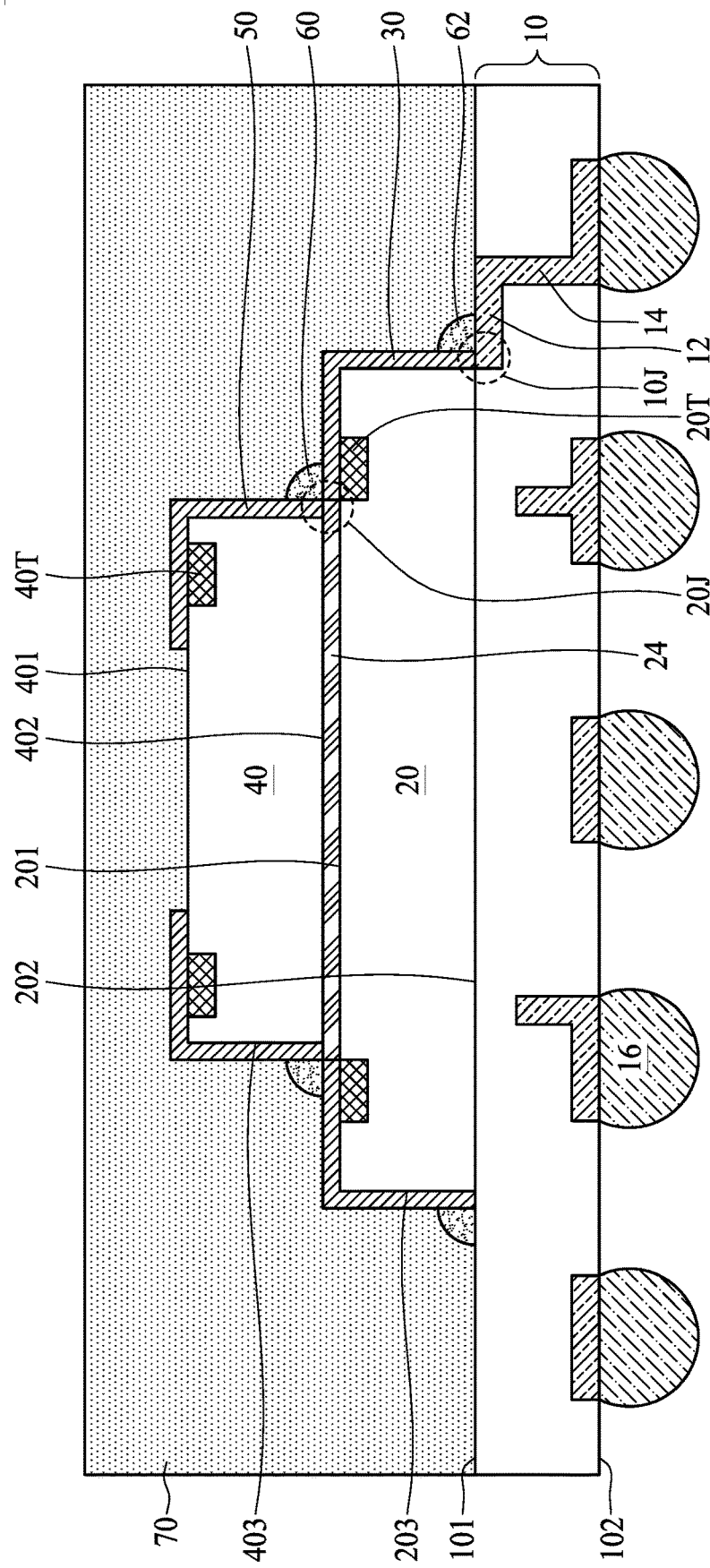
FIG. 4 is a cross-sectional view of a semiconductor device package in accordance with some embodiments of the present disclosure.

FIG. 4 is a cross-sectional view of a semiconductor device package 4 in accordance with some embodiments of the present disclosure. In contrast to the semiconductor device package 1 in FIG. 1, the first electronic component 20 and the second electronic component 40 may be homogeneous semiconductor dies. In some embodiments, the first electronic component 20 may include a logic die having larger width and/or length, and the second electronic component 40 may include a memory die having smaller width and/or length. The contact terminals 20T may be disposed on two opposite sides, three sides or four sides of the active surface 201, and the first conductive traces 30 may be disposed on two opposite lateral surfaces 203, three lateral surfaces 203 or four lateral surfaces 203 of the first electronic component 20 to electrically connect the respective contact terminals 20T. The contact terminals 40T may be disposed on two opposite sides, three sides or four sides of the active surface 401, and the second conductive traces 50 may be disposed on two opposite lateral surfaces 403, three lateral surfaces 403 or four lateral surfaces 403 of the second electronic component 40 to electrically connect the respective contact terminals 40T. Accordingly, I/O connections can be increased.

Figure 5A:
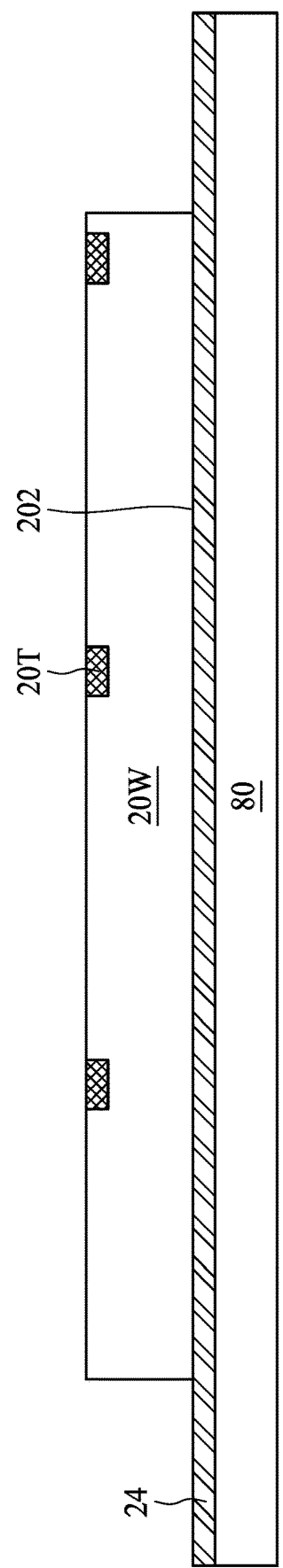
FIG. 5A, FIG. 5B, FIG. 5C and FIG. 5D illustrate operations of manufacturing electronic components in accordance with some embodiments of the present disclosure.
Figure 5B:
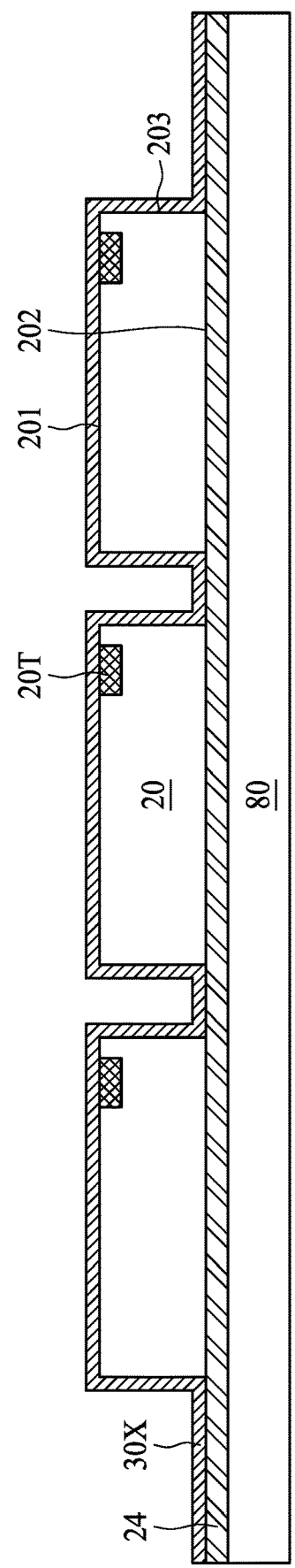

FIG. 5A, FIG. 5B, FIG. 5C and FIG. 5D illustrate operations of manufacturing electronic components in accordance with some embodiments of the present disclosure. As shown in FIG. 5A, a wafer 20W is received. The wafer 20W may include pre-formed electronic components such as the first electronic components 20 and/or the second electronic components 40 as illustrated in FIGS. 1, 1A, 1B and 2-4. The inactive surface 202 of the wafer 20W may be supported by a carrier 80. In some embodiments, the wafer 20W may be attached to the carrier 80 by a DAF 24, or the carrier 80 may be a DAF. As shown in FIG. 5B, the wafer 20W is preliminarily singulated to laterally separate the first electronic components 20 to expose the lateral surfaces 203, while the inactive surface 202 is still attached to the carrier 80. A conductive layer 30X is formed on active surfaces 201 and lateral surfaces 203 of the first electronic components 20. In some embodiments, the material of the conductive layer 30X may include metal such as copper or the like. The conductive layer 30X can be formed by physical vapor deposition (PVD) such as sputtering, electroplating, printing or other suitable processes.

Figure 5C:
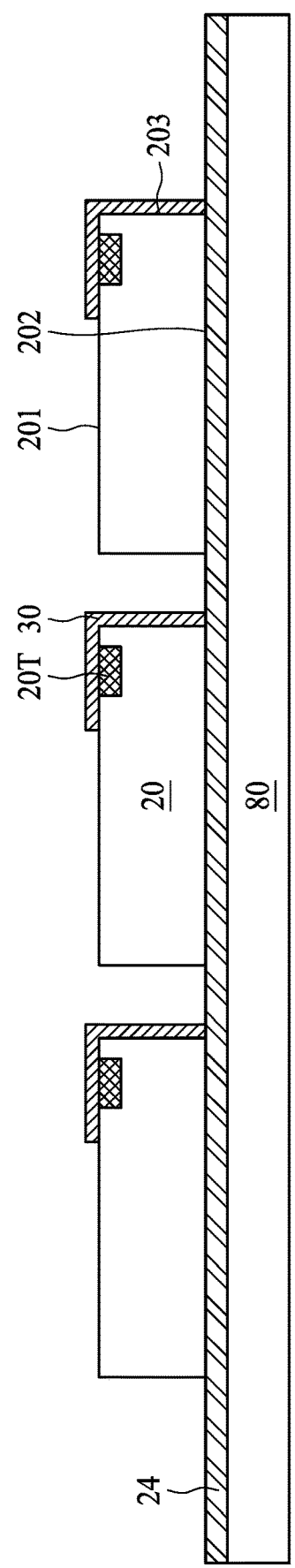

As shown in FIG. 5C, the conductive layer 30X is patterned to form the first conductive traces 30 partially on the active surface 201 and on the lateral surface 203 of the first electronic component 20. In some embodiments, the conductive layer 30X may be patterned by photolithography and etching techniques.

Figure 5D:
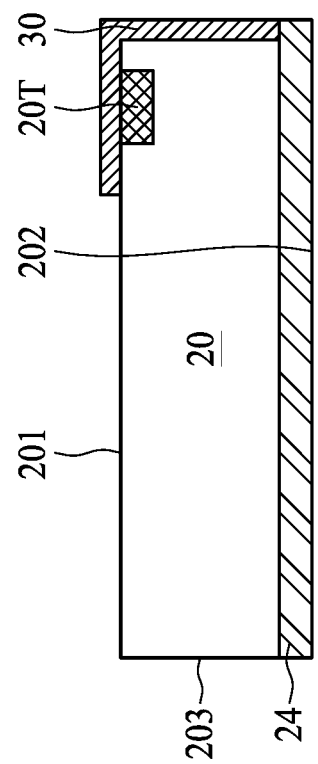

As shown in FIG. 5D, the DAF 24 is further singulated to separate the first electronic components 20. In some embodiments, the carrier 80 is removed from the inactive surface 202, and the DAF 24 may remain on the inactive surface 202.

In some embodiments, the second electronic components 40 may be manufactured in a similar manner as the first electronic components 20 as described in FIGS. 5A-5D. In case the first electronic components 20 and the second electronic components 40 are homogeneous semiconductor dies, the second electronic components 40 and the first electronic components 20 can be formed simultaneously.

Figure 6A:
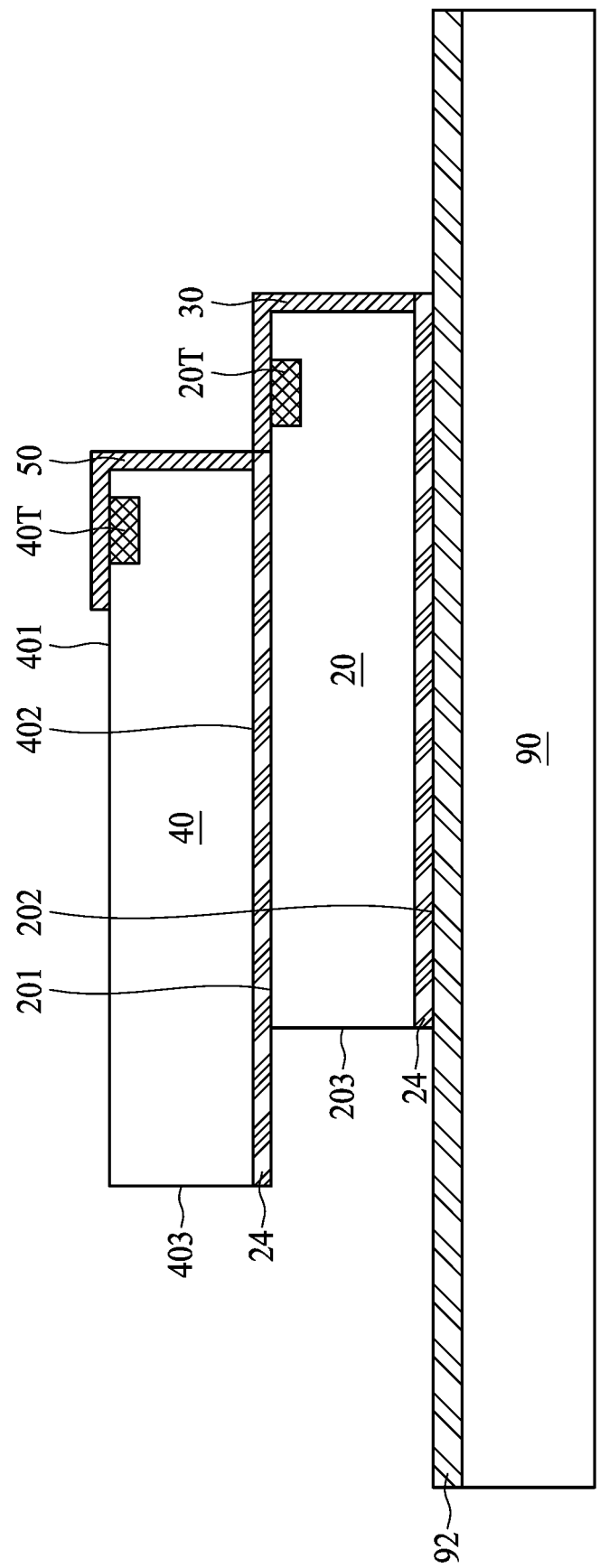
FIG. 6A, FIG. 6B, FIG. 6C, and FIG. 6D illustrate operations of manufacturing a semiconductor device package in accordance with some embodiments of the present disclosure.

FIG. 6A, FIG. 6B, FIG. 6C, and FIG. 6D illustrate operations of manufacturing a semiconductor device package in accordance with some embodiments of the present disclosure. As shown in FIG. 6A, a plurality of electronic components such as the first electronic component 20 and the second electronic component 40 are stacked to form a stacked structure. In some embodiments, the first electronic component 20 and the second electronic component 40 are stacked on a support carrier 90 and a releasing layer 92 may be disposed between the support carrier 90 and the stacked structure.

Figure 6B:
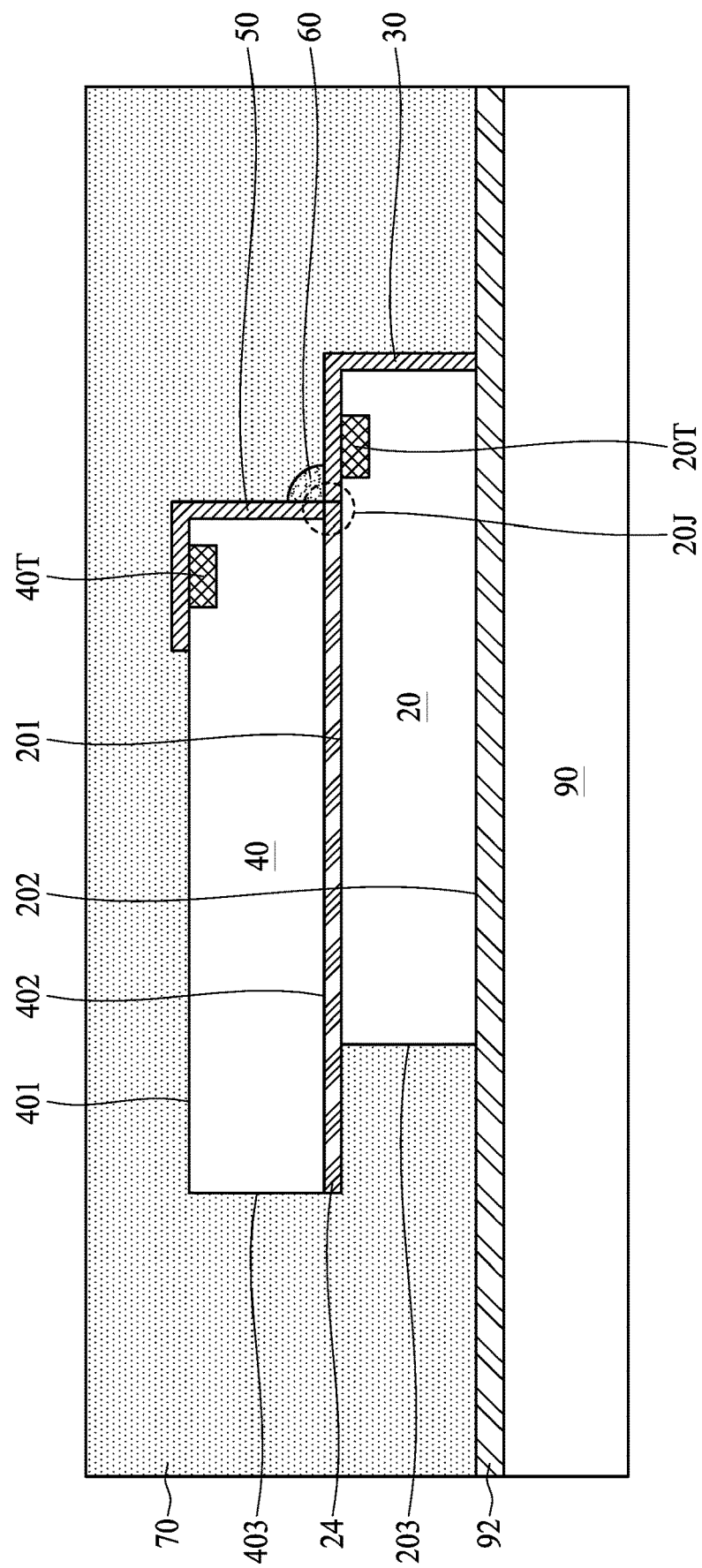

As shown in FIG. 6B, a plurality of first conductive structure 60 are formed to respectively electrically connect the first conductive traces 30 of the first electronic component 20 to the second conductive traces 50 of the second electronic component 40. An encapsulation layer 70 is formed to encapsulate the stacked structure.

Figure 6C:
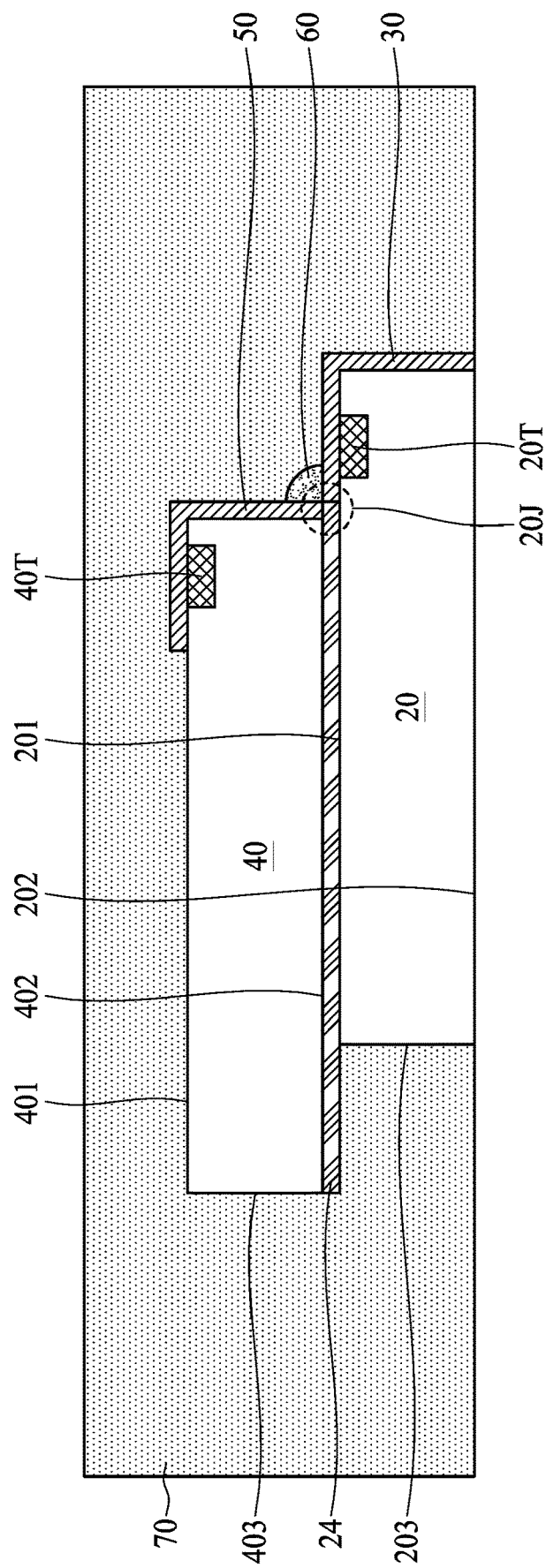

As shown in FIG. 6C, the support carrier 90 and the releasing layer 92 may be removed from the encapsulation layer 70. A circuit layer 10 can be electrically connected to the first electronic component 20, and electrical conductors 16 can be formed on the circuit layer 10 to form the semiconductor device packages as shown in FIGS. 1-4. The circuit layer 10 may be build up on the first electronic component 20. Alternatively, the circuit layer 10 may be pre-formed, and bonded to the first electronic component 20.

Figure 6D:
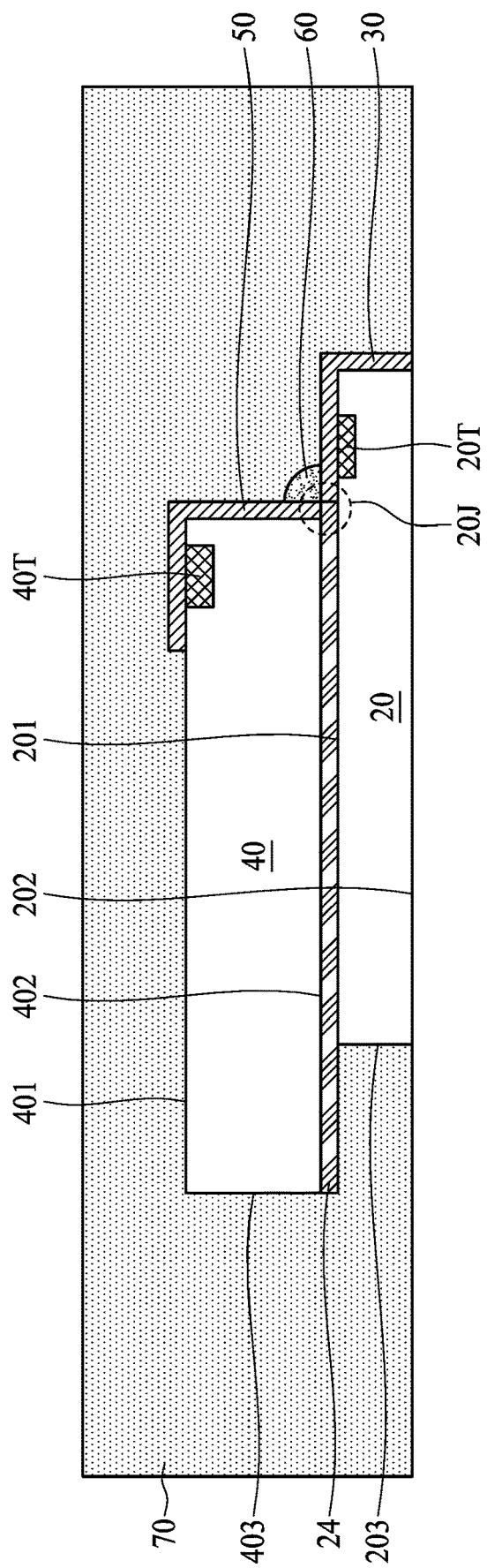

In some embodiments, as shown in FIG. 6D, the encapsulation layer 70 and the inactive surface 203 of the first electronic component 20 can be optionally grinded prior to electrically connecting the first electronic component 20 to the circuit layer 10 to form the semiconductor device package 3 as shown in FIG. 3.

Figure 7A:
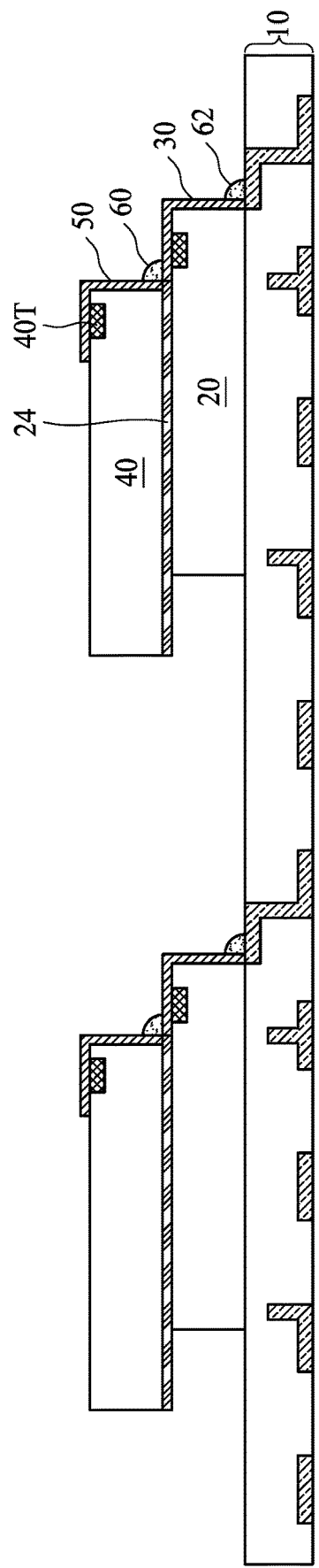
FIG. 7A, FIG. 7B and FIG. 7C illustrate operations of manufacturing a semiconductor device package in accordance with some embodiments of the present disclosure.
Figure 7B:
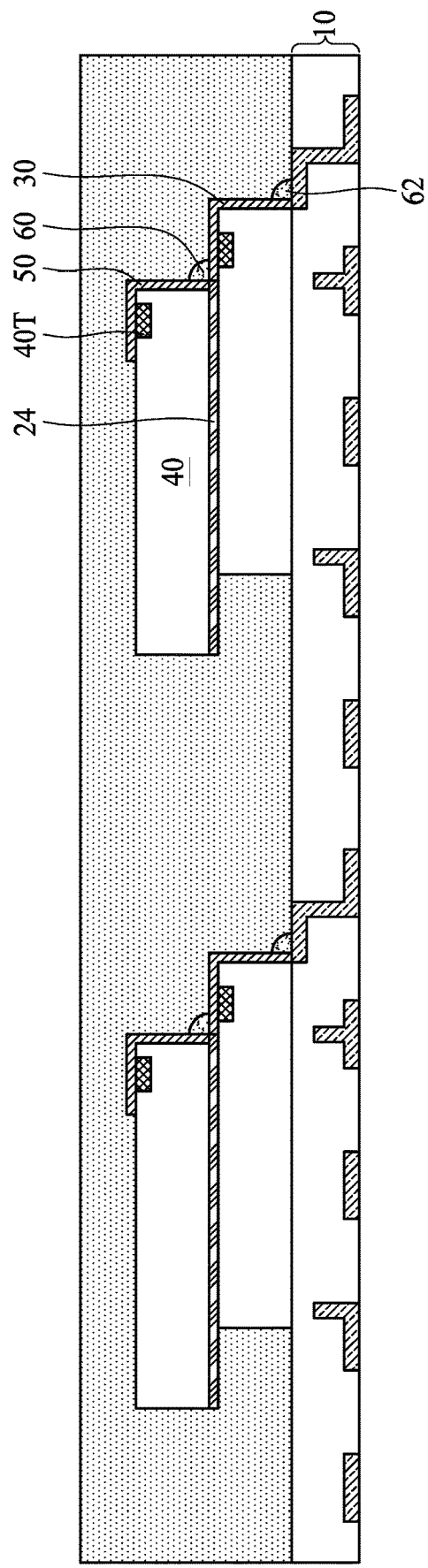
Figure 7C:
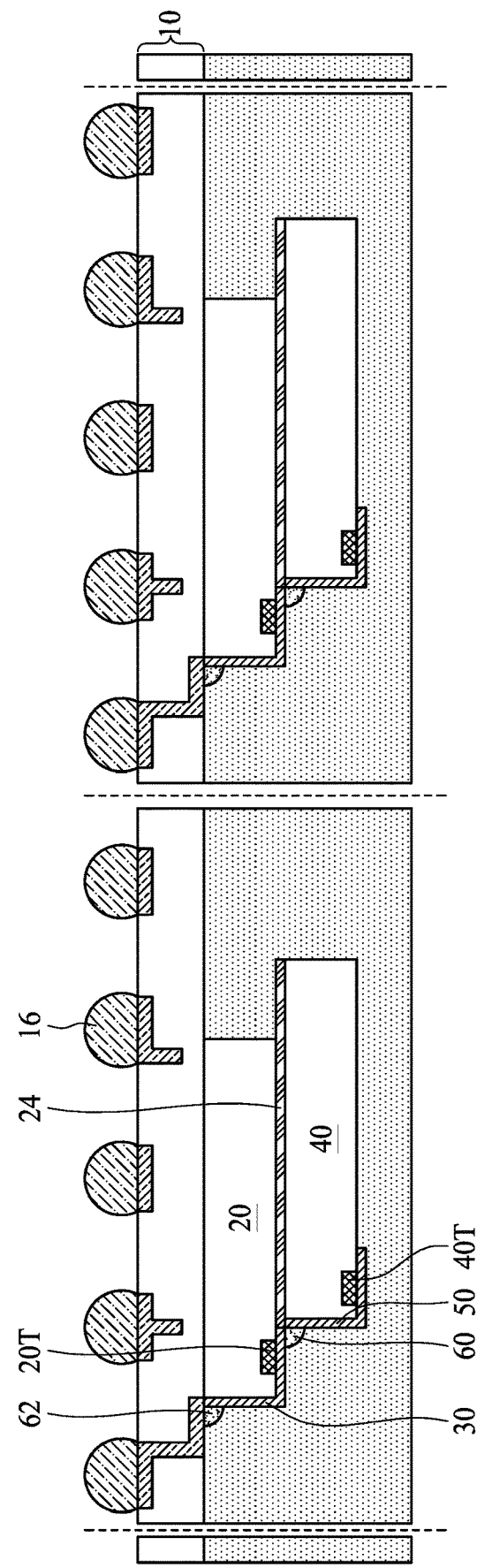

FIG. 7A, FIG. 7B and FIG. 7C illustrate operations of manufacturing a semiconductor device package in accordance with some embodiments of the present disclosure. As shown in FIG. 7A, a plurality of stacked structure each including the first electronic component 20 and the second electronic component 40 are electrically connected to a circuit layer 10.

As shown in FIG. 7B, the first conductive structures 60 are formed to electrically connect the second conductive traces 50 to the respective first conductive traces 30. In some embodiments, a plurality of second conductive structures 62 are formed to electrically connect the first conductive traces 30 to the circuit layer 10. An encapsulation layer 70 is then formed to encapsulate the stacked structure.

As shown in FIG. 7C, a plurality of electrical conductors 16 are formed on the circuit layer 10. A singulation process is performed to form a plurality of semiconductor device packages as shown in FIGS. 1-4.

Figure 8:
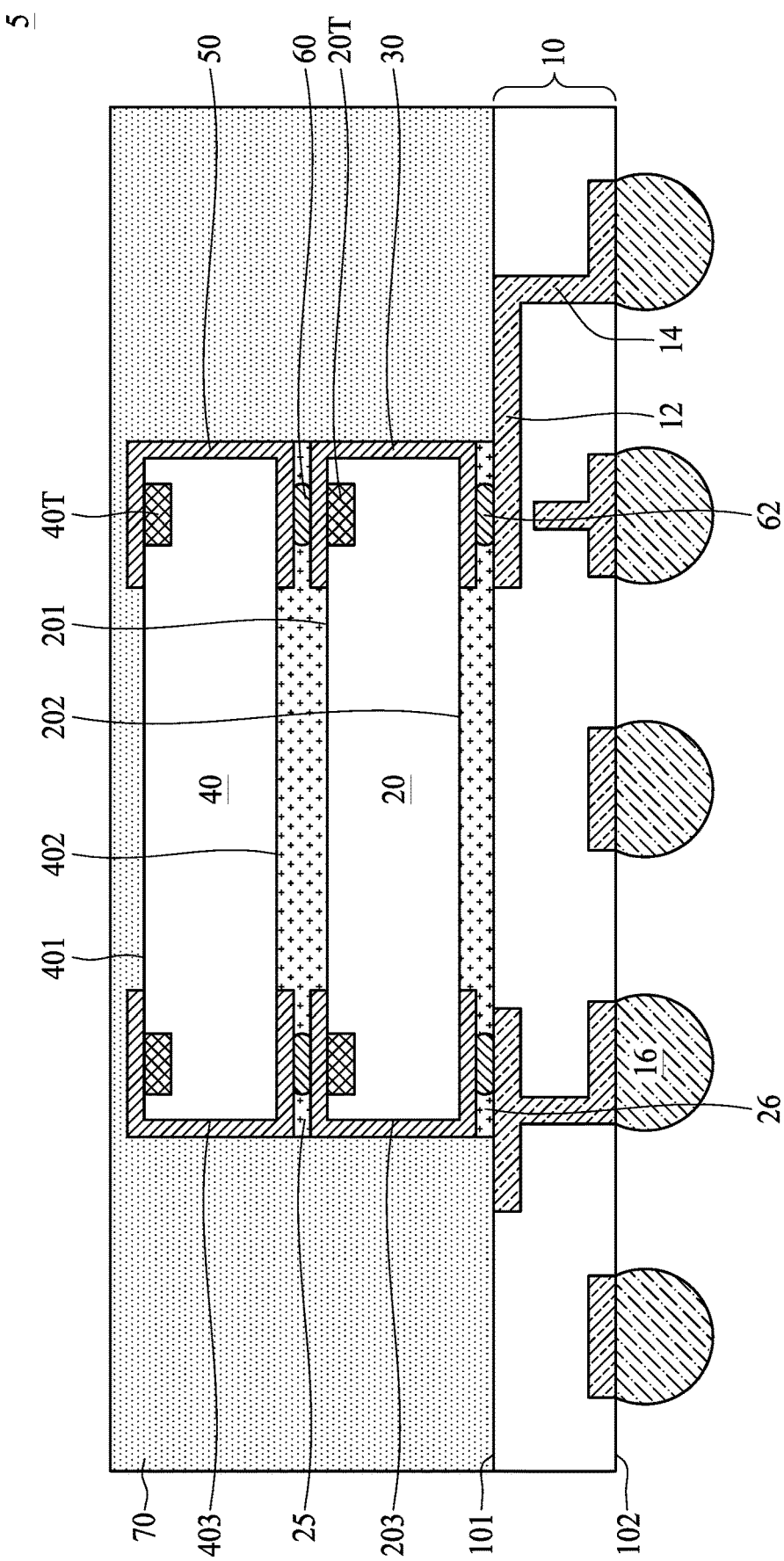
FIG. 8 is a cross-sectional view of a semiconductor device package in accordance with some embodiments of the present disclosure.
Figure 8A:
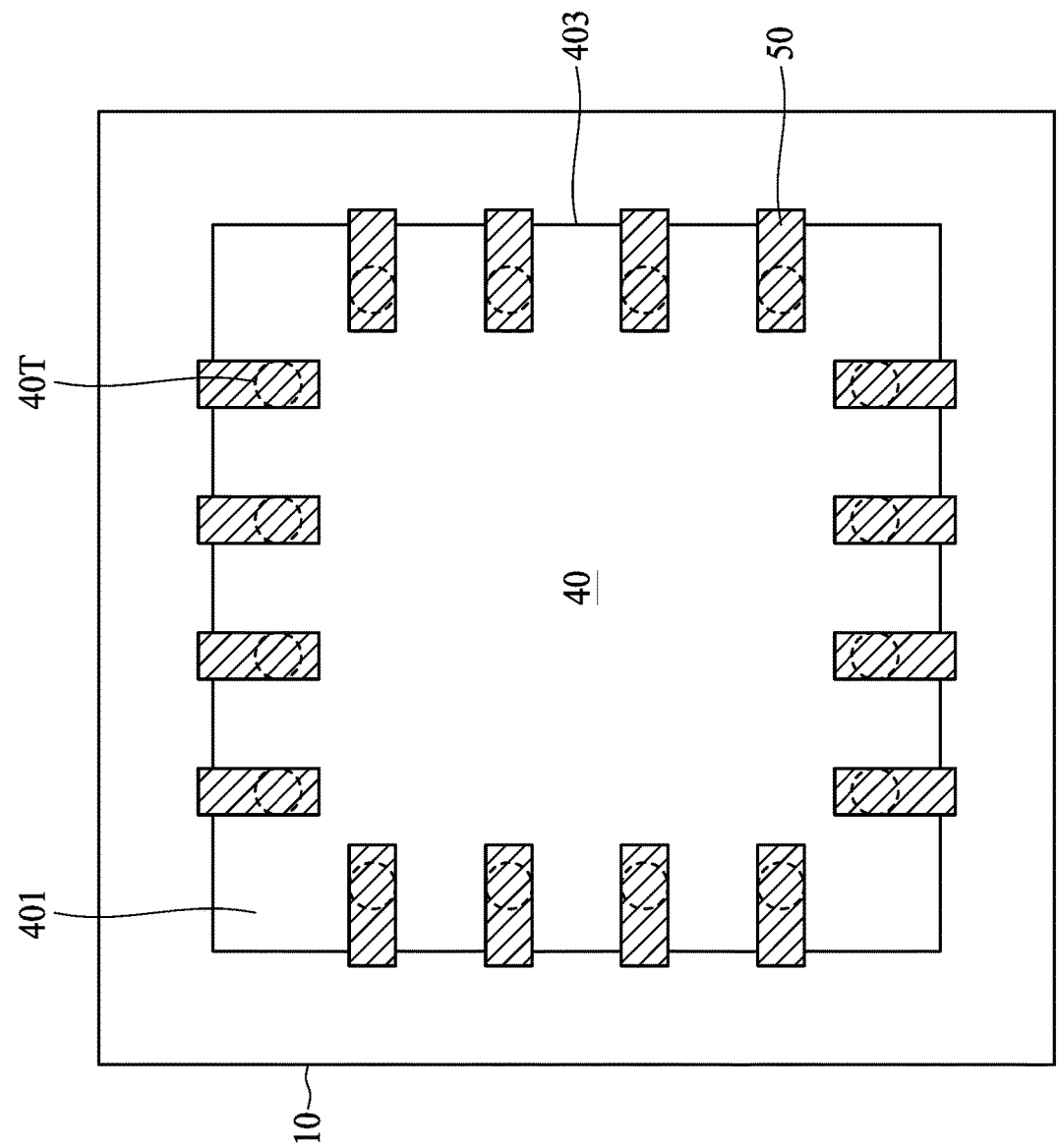
FIG. 8A is a top view of a semiconductor device package of FIG. 8 in accordance with some embodiments of the present disclosure.

FIG. 8 is a cross-sectional view of a semiconductor device package 5 in accordance with some embodiments of the present disclosure, and FIG. 8A is a top view of a semiconductor device package 5 of FIG. 8 in accordance with some embodiments of the present disclosure. In FIG. 8A, some component such as an encapsulation layer is omitted. As shown in FIG. 8 and FIG. 8A, the first conductive traces 30 may further extend from the lateral surface 203 to the inactive surface 202 of the first electronic component 20, and the second conductive traces 50 may further extend from the lateral surface 403 to the inactive surface 402 of the second electronic component 40.

In some embodiments, a portion of the first conductive traces 30 may extend from the active surface 201 to one of the at least one lateral surface 203, and reach the inactive surface 202 of the first electronic component 20. Another portion of the first conductive traces 30 may extend from the active surface 201 to another one of the at least one lateral surface 203, and reach the inactive surface 202 of the first electronic component 20. In some embodiments, a portion of the second conductive traces 50 may extend from the active surface 401 to one of the at least one lateral surface 403, and reach the inactive surface 402 of the second electronic component 40. Another portion of the second conductive traces 50 extend from the active surface 401 to another one of the at least one lateral surface 403, and reach the inactive surface 202 of the second electronic component 40.

The first conductive structures 60 may be disposed between the inactive surface 403 of the second electronic component 40 and the active surface 201 of the first electronic component 20. The second conductive structures 62 may be disposed between the inactive surface 203 of the first electronic component 20 and the first surface 101 of the circuit layer 10. In some embodiments, the first conductive structures 60 and the second conductive structures 62 may include conductive bumps such as solder bumps, metal bumps or the like. In some embodiments, an underfill 25 may be disposed between the first electronic component 20 and the second electronic component 40. Another underfill 26 may be disposed between the first electronic component 20 and the circuit layer 10.

Figure 9:
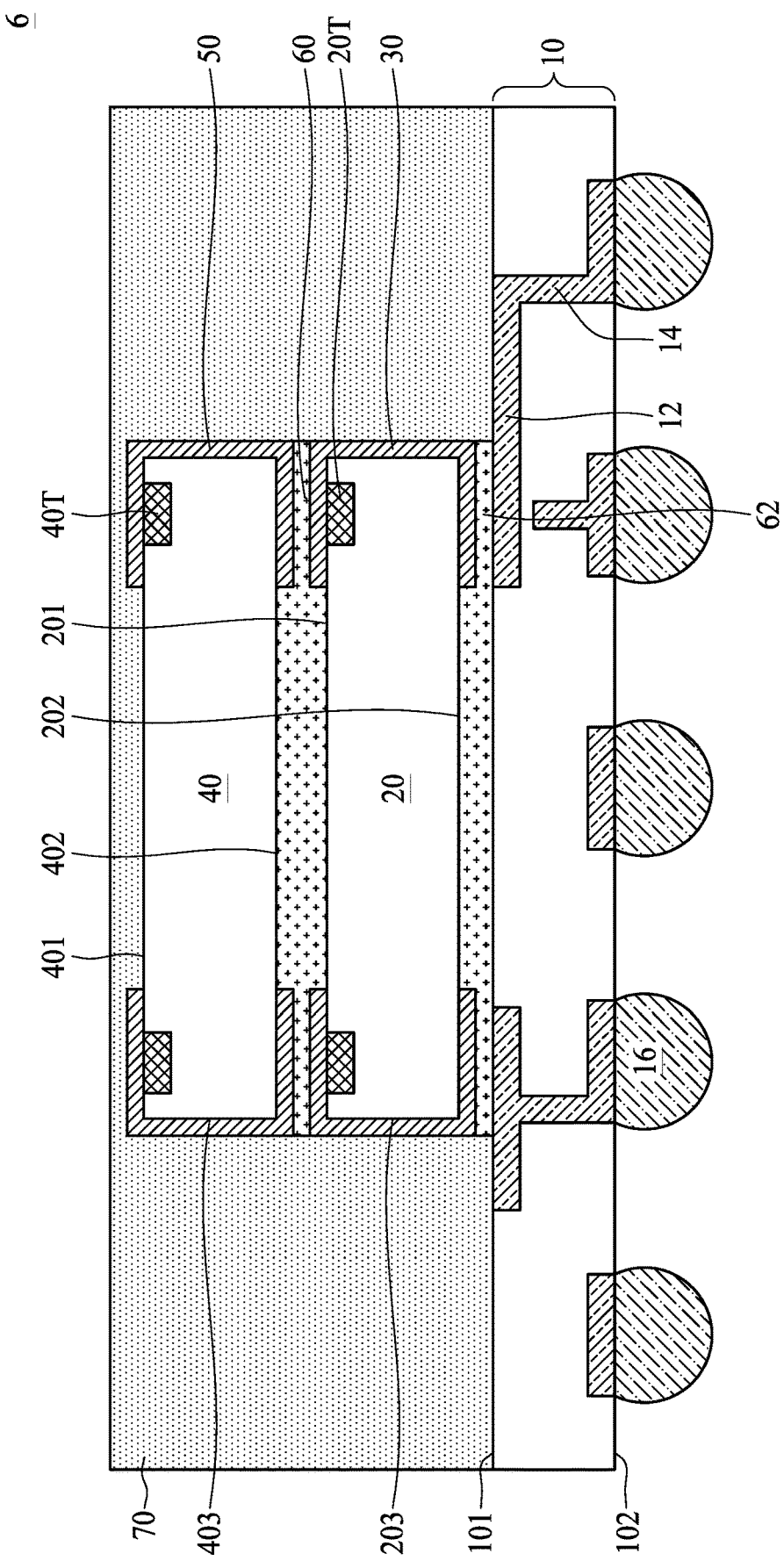
FIG. 9 is a cross-sectional view of a semiconductor device package in accordance with some embodiments of the present disclosure.

FIG. 9 is a cross-sectional view of a semiconductor device package 6 in accordance with some embodiments of the present disclosure. In contrast to the semiconductor device package 5 in FIG. 8, the first conductive structures 60 and the second conductive structures 62 may include anisotropic conductive film (ACF). The ACF allows bonding the first electronic component 20 and the second electronic component 40, and providing electrical connection along a specific direction such as the direction perpendicular to the active surface 201.

In some embodiments of the present disclosure, the semiconductor device package uses conductive traces that extend from active surfaces to lateral surfaces of stacking semiconductor dies to implement interconnection. The thickness of the encapsulation layer can be reduced. The resistance and electrical transmission path of the interconnection can be reduced. The I/O density and the productivity can be increased.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
a first electronic component having a first active surface;
a plurality of first conductive traces disposed on and electrically connected to the first active surface;
a second electronic component stacked on the first electronic component, the second electronic component having an inactive surface facing the first active surface, a second active surface opposite the inactive surface, and at least one lateral surface connecting the second active surface and the inactive surface;

a plurality of second conductive traces electrically connected to the second active surface, and extending from the second active surface to the at least one lateral surface; and a plurality of first conductive structures electrically connecting the second conductive traces to the first conductive traces, respectively, wherein at least one of the plurality of the first conductive traces is discontinuous to at least one of the plurality of the second conductive traces.

2. The semiconductor device package of claim 1, wherein the first active surface of the first electronic component is partially exposed by the second electronic component.

3. The semiconductor device package of claim 2, wherein the first conductive structures are disposed at a joint corner between the first active surface of the first electronic component and the lateral surface of the second electronic component.

4. The semiconductor device package of claim 1, wherein the second conductive traces further extend from the lateral surface to the inactive surface of the second electronic component.

5. The semiconductor device package of claim 4, wherein the first conductive structures are disposed between the inactive surface of the second electronic component and the active surface of the first electronic component.

6. The semiconductor device package of claim 1, wherein a portion of the second conductive traces extend from the second active surface to one of the at least one lateral surface of the second electronic component, and another portion of the second conductive traces extend from the second active surface to another one of the at least one lateral surface of the second electronic component.

7. The semiconductor device package of claim 1, further comprising an encapsulation layer encapsulating the first electronic component and the second electronic component.

8. The semiconductor device package of claim 1, further comprising a circuit layer on which the first electronic component is disposed.

9. The semiconductor device package of claim 8, wherein the first electronic component include at least one lateral surface, and the first conductive traces further extend to the lateral surface of the first electronic component and electrically connect the circuit layer.

10. The semiconductor device package of claim 1, wherein the first electronic component comprises a circuit layer, and the second electronic component comprises a semiconductor die.

11. The semiconductor device package of claim 10, further comprising an encapsulation layer encapsulating the semiconductor die.

12. The semiconductor device package of claim 1, wherein the first conductive structures comprises a flow-able conductive material.

13. The semiconductor device package of claim 1, wherein the first conductive structures comprises conductive bumps.

14. The semiconductor device package of claim 1, wherein the first conductive structures comprises anisotropic conductive film (ACF).

15. The semiconductor device package of claim 1, wherein the first electronic component includes a plurality of first contact terminals exposed from the first active surface, the first conductive traces are electrically connected to the first contact terminals, the second electronic component includes a plurality of second contact terminals exposed from the second active surface, and the second conductive traces are electrically connected to the second contact terminals.

16. The semiconductor device package of claim 1, wherein the first electronic component includes a first inactive surface opposite to the first active surface and a lateral surface connecting the first active surface and the first inactive surface, and at least one of the plurality of the first conductive traces is substantially conformal to the first active surface and the lateral surface.

17. The semiconductor device package of claim 1, further comprising an encapsulation layer encapsulating the plurality of the first conductive traces, the plurality of the second conductive traces, and the plurality of the first conductive structures.

18. The semiconductor device package of claim 1, wherein one end of at least one of the plurality of the first conductive traces is in contact with one end of at least one of the plurality of the second conductive traces.

19. The semiconductor device package of claim 1, wherein the plurality of first conductive structures are disposed adjacent to an interface between the first conductive traces and the second conductive traces, respectively.

20. A semiconductor device package, comprising:
a first semiconductor die having a first active surface and at least one first lateral surface connecting the first active surface;
a first conductive trace disposed on the first active surface and electrically connected to the first semiconductor die, and extending from the first active surface to the at least one first lateral surface;
a second semiconductor die stacking on the first semiconductor die and partially exposing the first active surface of the first semiconductor die, the second semiconductor die having an inactive surface facing the first active surface, a second active surface opposite the inactive surface, and at least one second lateral surface connecting the second active surface and the inactive surface;
a second conductive trace electrically connected to the second semiconductor die, and extending from the second active surface to the at least one second lateral surface; and
a conductive bonding enhancing structure disposed at a joint corner between the first active surface and the at least one second lateral surface, wherein the first conductive trace is discontinuous to the second conductive trace.

21. The semiconductor device package of claim 20, wherein the first semiconductor die and the second semiconductor die comprise homogeneous semiconductor dies, and a thickness of the first semiconductor die is smaller than that of the second semiconductor die.

* * * * *